United States Patent
Spring

(10) Patent No.: US 7,504,679 B2
(45) Date of Patent: Mar. 17, 2009

(54) ENHANCEMENT MODE GAN FET WITH PIEZOELECTRIC GATE

(75) Inventor: Kyle Spring, Temecula, CA (US)

(73) Assignee: International Rectifier Corporation, El Segundo, CA (US)

(*) Notice: Subject to any disclaimer, the term of this patent is extended or adjusted under 35 U.S.C. 154(b) by 17 days.

(21) Appl. No.: 11/780,737

(22) Filed: Jul. 20, 2007

(65) Prior Publication Data

US 2008/0017867 A1    Jan. 24, 2008

Related U.S. Application Data

(60) Provisional application No. 60/807,838, filed on Jul. 20, 2006.

(51) Int. Cl.
*H01L 29/15* (2006.01)

(52) U.S. Cl. .................................. 257/288; 257/76

(58) Field of Classification Search ............... 257/76, 257/288
See application file for complete search history.

(56) References Cited

U.S. PATENT DOCUMENTS

| | | | | |
|---|---|---|---|---|
| 5,322,808 A | * | 6/1994 | Brown et al. ............... | 117/105 |
| 2002/0139995 A1 | * | 10/2002 | Inoue et al. ................ | 257/194 |
| 2005/0145883 A1 | * | 7/2005 | Beach et al. ............... | 257/194 |
| 2006/0060871 A1 | * | 3/2006 | Beach ........................ | 257/94 |
| 2007/0057290 A1 | * | 3/2007 | Ishida et al. ............... | 257/213 |

* cited by examiner

*Primary Examiner*—Roy K Potter
(74) *Attorney, Agent, or Firm*—Ostrolenk, Faber, Gerb & Soffen, LLP

(57) ABSTRACT

One or more enhancement mode GaN devices has a stress-reduced gate region which interrupts the normally conductive 2Deg layer. A piezoelectric film is disposed over the stress-reduced gate region and can be excited to deflect and apply a stress to the stress reduced gate region to reintroduce the conductive 2Deg layer in that region and to turn on the device. A depletion mode segment may also be provided.

15 Claims, 3 Drawing Sheets

ENHANCEMENT MODE GAN FET WITH PIEZOELECTRIC GATE

RELATED APPLICATIONS

This application claims the benefit of U.S. Provisional Application No. 60/807,838, filed Jul. 20, 2006, the entire disclosure of which is incorporated by reference herein.

FIELD OF THE INVENTION

This invention relates to semiconductor devices and more specifically relates to an enhancement mode GaN FET and to an assembly of such device with depletion mode devices on a common chip or die.

BACKGROUND OF THE INVENTION

III Nitride semiconductor devices, specifically GaN based switching devices, are well known. Such devices are normally depletion mode devices in which a normally conducting electron gas or 2Deg layer is formed, for example, between a GaN layer and an AlGaN layer atop the GaN layer. A gate structure atop the AlGaN layer is operable to interrupt the normally conducting 2Deg layer to turn off the normally conducting 2Deg or electron gas layer.

It would be very desirable to employ the characteristics of III Nitride devices in a normally off enhancement mode FET or in a power device with a plurality of enhancement mode and depletion mode devices.

BRIEF DESCRIPTION OF THE INVENTION

In accordance with the invention, a multilayer GaN substrate is fabricated using convention methods. A portion of the strain layer (such as an AlGaN layer atop a GaN layer) is removed, as by etching, in a gate region, to remove the strain in that region, and hence suppress the electron gas under the etched region, thus interrupting the lateral conduction path through the 2Deg layer. A piezoelectric film is then deposited into the etched region and is patterned. Conventional metallizing and patterning processes are used to form the necessary source and drain electrodes and a gating electrode on the piezoelectric film. The application of gate voltage to the piezoelectric gate will cause it to deflect and apply a strain to the previously unstrained area of the 2Deg layer to permit the flow of current through the 2Deg layer.

The result is an enhancement mode PE (piezoelectric)-FET for switching power applications.

A termination region formed by etching away the AlGaN layer or strain layer which lies along the sides of the enhancement mode device (or surrounds the device) is provided to prevent current flow through a parallel 2Deg layer.

A plurality of gates, including either or both enhancement mode and conventional depletion mode GaN devices can be formed in a common substrate to provide a wider channel per unit area; and/or assemblages of depletion mode and enhancement mode devices in pairs to form logic circuits and the like.

DESCRIPTION OF THE DRAWING

Figure 1:
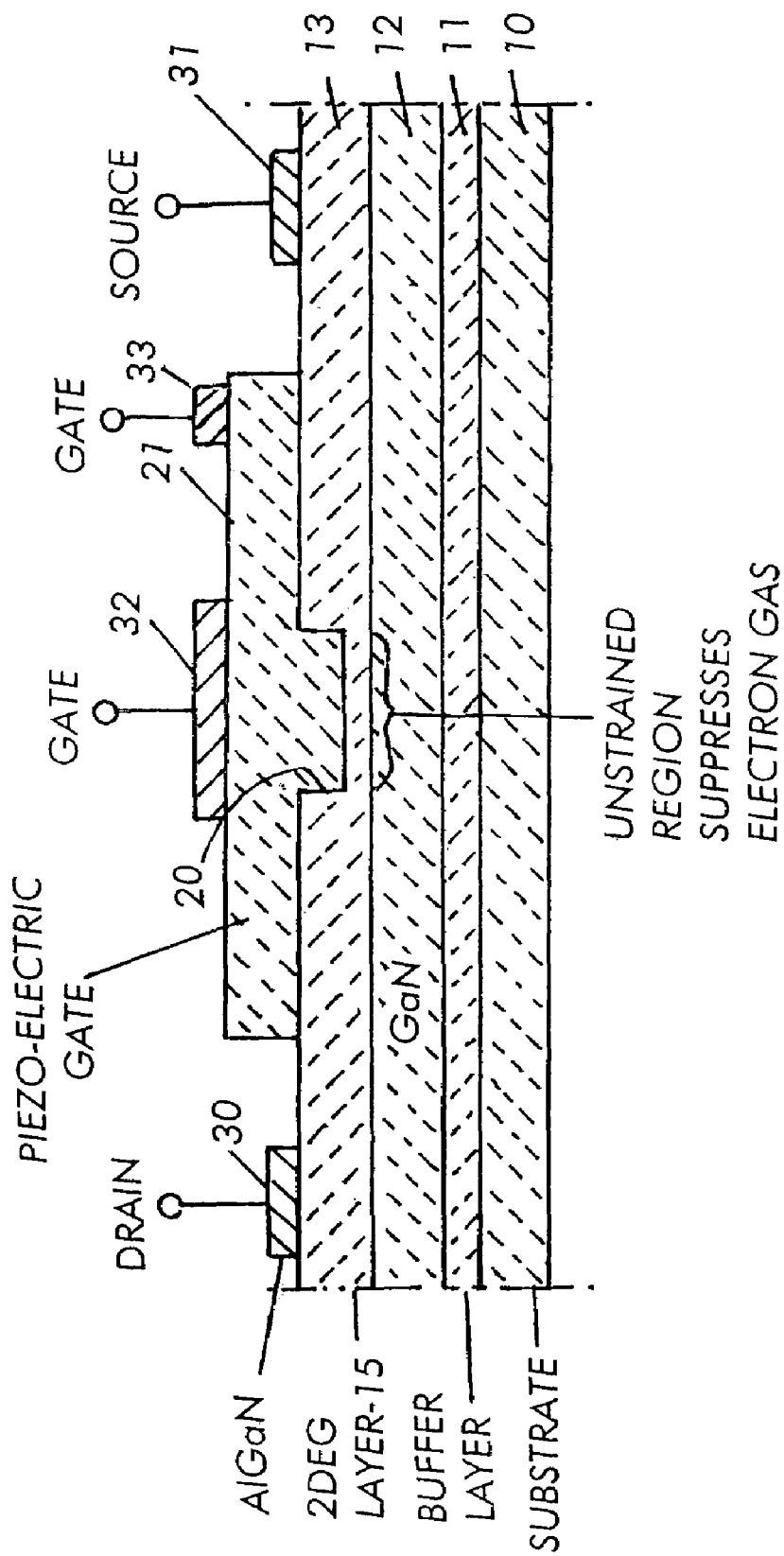
FIG. 1 is a cross-section of a small portion of an enhancement mode field effect transistor made in accordance with the invention.

Referring to FIG. 1, one manner in which the invention can be implemented is shown.

The device is built on a substrate 10 which may be silicon, SiC, or any other of the well known substrate materials. A conventional buffer layer 11 may be formed on the substrate and a GaN layer 12 is conventionally deposited atop the buffer layer 11. An AlGaN strain layer 13 is then deposited atop GaN layer 12, forming a normally "on" 2Deg conduction layer 15 at the interface between layers 12 and 13. All of the above processes are well known.

Figure 2:
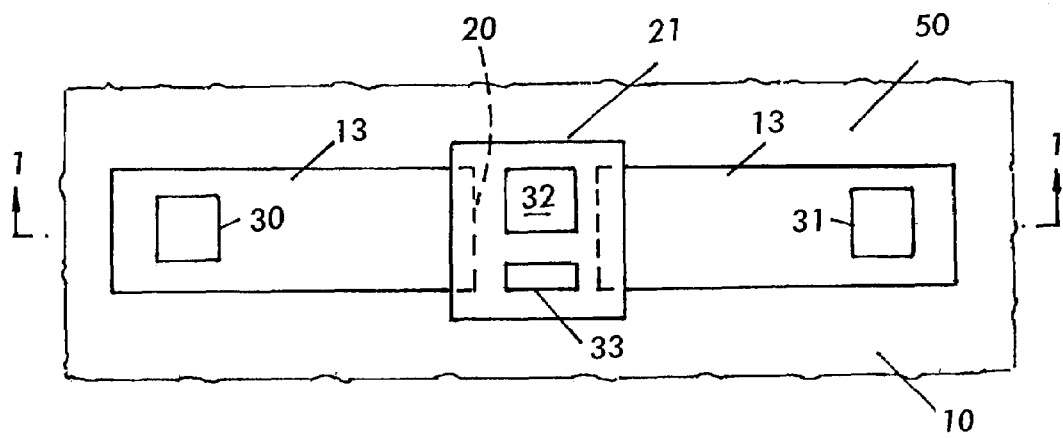
FIG. 2 is a top view of FIG. 1.
Figure 3:
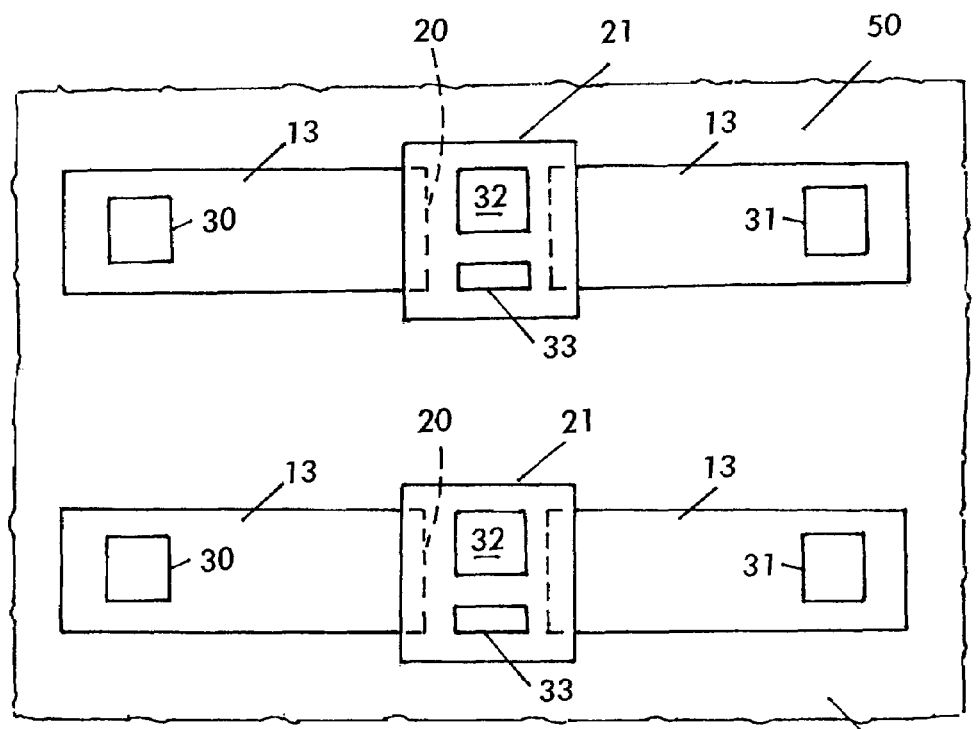
FIG. 3 is a top view of a device like that of FIGS. 1 and 2 in which a plurality of enhancement mode devices are formed in a common die or chip.

In accordance with the invention, the strain layer 13 is etched with a window 20 which may extend either partially through, or fully through layer 13. A piezoelectric gate film 21 which may be P2T is then formed into window 20 using deposition and patterning processes which are well known. Further, layer 13 is formed in strips as shown in FIG. 2, surrounded by termination region 50 in which the strain layer along the device sides are removed to prevent a parallel conduction path. Plural parallel strips may be used with an interdigitated structure if desired as shown in FIG. 3 to increase channel width.

Electrodes (30 and 31) are then deposited and patterned to form drain and source contacts and conductive gate electrodes 32 and 33 are deposited on piezoelectric film 21.

The removal of the AlGaN strain layer in window 20 or a portion thereof removes or relieves the strain which otherwise forms the electron gas or 2Deg conduction layer at the interface between layers 12 and 13.

When no gate signal is applied to gate 32-33, the film 21 is unstressed and applies no stress to 2Deg layer 15. Thus, the electron gas layer or 2Deg layer is suppressed in the area of window 20 so the circuit between the source electrode 31 and drain electrode 30 is open. However, when a gate voltage is applied to the piezoelectric gate 32, the film 21 deflects to create a strain field at the bottom of window 20, pressing against the bottom of window 20, creating the 2Deg electron gas in the gate area and establishing a conductive path between source and drain.

FIG. 3 shows a view like that of FIG. 2 in which a plurality of devices like that of FIG. 2 are formed and may be connected in parallel to increase channel width. Any desired number of such devices can be provided.

Figure 4:
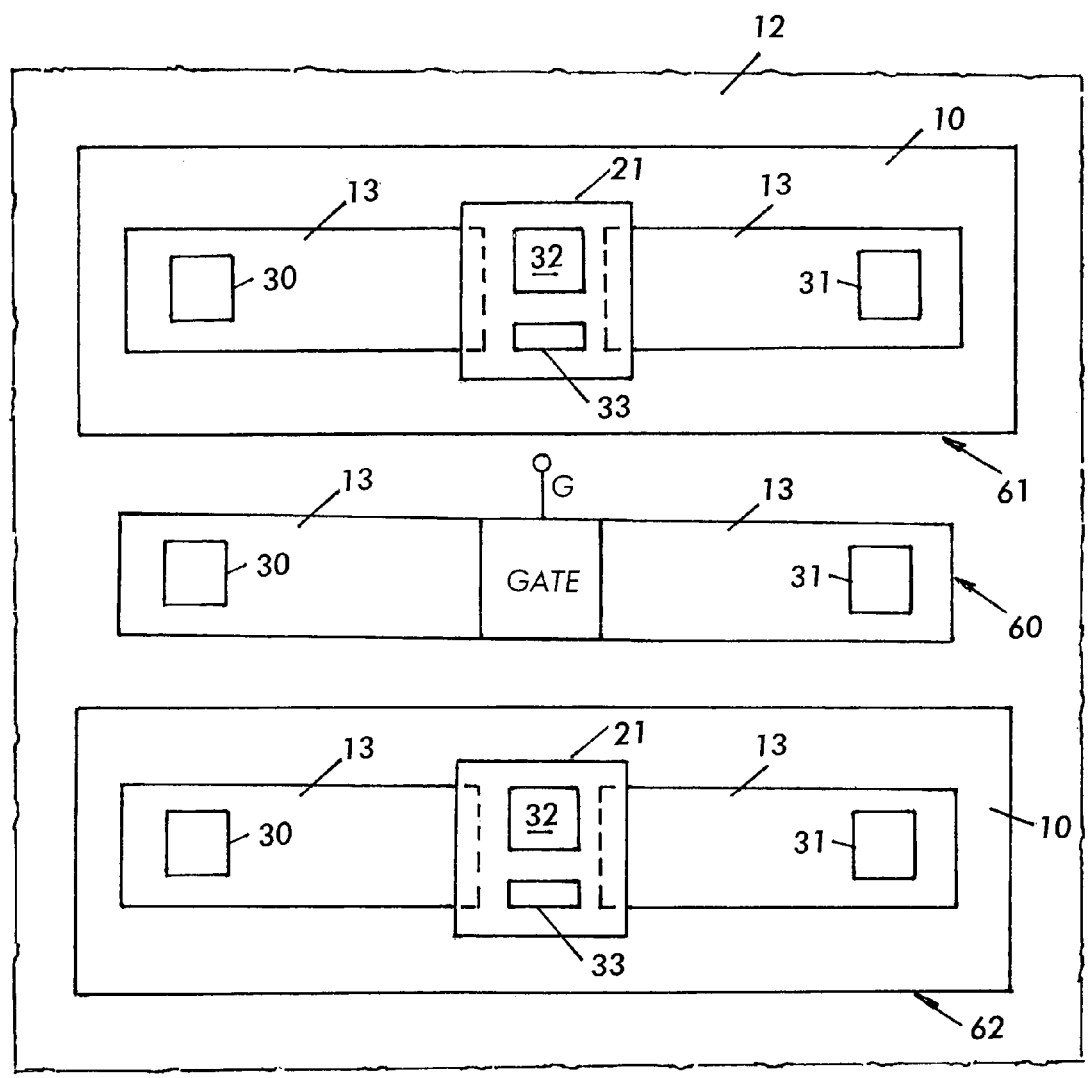
FIG. 4 is a top view of a device like that of FIG. 3 in which a depletion mode GaN device is added to the chip.

FIG. 4 shows a device like that of FIG. 3 in which a depletion mode device 60 strip is added between enhancement mode devices 61 and 62. This array will permit the connection of the devices in any desired array.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An enhancement mode GaN FET comprising:
a substrate;
a buffer layer atop said substrate;
a GaN layer atop said buffer layer;
an AlGaN layer atop said GaN layer to define a conductive 2Deg layer at their interface;

an opening in said AlGaN layer to remove the strain which defines the electron gas of said 2Deg layer at the bottom of said opening;

a piezoelectric gate disposed in said opening for controllably applying a strain to the unstrained portion of said 2Deg layer adjacent said opening;

and source and drain electrodes atop said AlGaN layer and on opposite sides of said opening.

2. The device of claim 1, wherein said opening extends only partially from the top of said AlGaN layer, leaving a thin web of AlGaN atop said GaN layer.

3. The device of claim 1, wherein said piezoelectric gate comprises a thin film having a gate electrode on its top surface.

4. The device of claim 2, wherein said piezoelectric gate comprises a thin film having a gate electrode on its top surface.

5. The process of operating a GaN FET in the enhancement mode, comprising the removal of stress from a selected region of its 2Deg layer to interrupt conduction of current through said 2Deg layer and applying a mechanical stress to said selected region to reestablish the 2Deg layer in said selected region.

6. The process of claim 5, which includes a piezoelectric film disposed over said selected region for applying said mechanical stress and gate means on said piezoelectric film to cause said film to deflect to produce said mechanical stress in response to the application of a gate voltage to said gate.

7. The enhancement mode GaN FET of claim 1, which further includes a termination region surrounding said FET to prevent parallel conduction of current through the 2Deg layer external to said enhancement mode GaN FET.

8. The enhancement mode GaN FET of claim 2, which further includes a termination region surrounding said FET to prevent parallel conduction of current through the 2Deg layer external to said enhancement mode GaN FET.

9. The enhancement mode GaN FET of claim 4, which further includes a termination region surrounding said FET to prevent parallel conduction of current through the 2Deg layer external to said enhancement mode GaN FET.

10. The enhancement mode GaN FET of claim 1, which further includes at least a second identical GaN FET laterally displaced from said GaN FET and connected in a parallel therewith to increase channel width.

11. The device of claim 10, which further includes a termination region surrounding each of said FETs to prevent parallel conduction of current through the 2Deg layer external to each of said FETs.

12. The enhancement mode FET of claim 1, which further includes at least one depletion mode FET formed in said GaN layer and said AlGaN layer which depletion mode FET is laterally displaced from said enhancement mode FET.

13. The enhancement mode FET of claim 7, which further includes at least one depletion mode FET formed in said GaN layer and said AlGaN layer which depletion mode FET is laterally displaced from said enhancement mode FET.

14. The enhancement mode FET of claim 10, which further includes at least one depletion mode FET formed in said GaN layer and said AlGaN layer which depletion mode FET is laterally displaced from said enhancement mode FET.

15. The enhancement mode FET of claim 11, which further includes at least one depletion mode FET formed in said GaN layer and said AlGaN layer which depletion mode FET is laterally displaced from said enhancement mode FET.

* * * * *